US011183491B2

(12) United States Patent
Uejima

(10) Patent No.: US 11,183,491 B2
(45) Date of Patent: Nov. 23, 2021

(54) HIGH-FREQUENCY MODULE

(71) Applicant: Murata Manufacturing Co., Ltd., Nagaokakyo (JP)

(72) Inventor: Takanori Uejima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/407,249

(22) Filed: May 9, 2019

(65) Prior Publication Data

US 2019/0393203 A1 Dec. 26, 2019

(30) Foreign Application Priority Data

Jun. 25, 2018 (JP) .............................. JP2018-119425

(51) Int. Cl.
*H01L 25/00* (2006.01)
*H01L 25/18* (2006.01)

(52) U.S. Cl.
CPC .................................. *H01L 25/18* (2013.01)

(58) Field of Classification Search
CPC ...................................................... H01L 25/18
See application file for complete search history.

(56) References Cited

U.S. PATENT DOCUMENTS

2012/0250195 A1* 10/2012 Chang .................... H02H 9/046
361/56

FOREIGN PATENT DOCUMENTS

| JP | 2002-57242 A | 2/2002 |
| JP | 2003-124701 A | 4/2003 |
| JP | 2007-042762 A | 2/2007 |
| JP | 2007-096198 A | 4/2007 |

OTHER PUBLICATIONS

Official Communication issued in corresponding Korean Patent Application No. 10-2019-0053443, dated Aug. 3, 2020.

* cited by examiner

*Primary Examiner* — Mounir S Amer
*Assistant Examiner* — Alexander Belousov
(74) *Attorney, Agent, or Firm* — Keating & Bennett, LLP

(57) ABSTRACT

A high-frequency module includes a mounting substrate, electronic components, a sealing resin, and land conductors. The mounting substrate includes a front surface, a rear surface, and a side surface. The land conductors are provided on the rear surface. The electronic components are mounted on the front surface of the mounting substrate. A distance between the mounting surface of the land conductor near the side surface and the rear surface of the mounting substrate is larger than a distance between the mounting surface of the land conductor closer to the center than the land conductor near the side surface and the rear surface of the mounting substrate.

17 Claims, 4 Drawing Sheets

HIGH-FREQUENCY MODULE

CROSS REFERENCE TO RELATED APPLICATIONS

This application claims the benefit of priority to Japanese Patent Application No. 2018-119425 filed on Jun. 25, 2018. The entire contents of this application are hereby incorporated herein by reference.

BACKGROUND OF THE INVENTION

1. Field of the Invention

The present invention relates to a high-frequency module including a mounting substrate on a front surface of which a high frequency electronic component is mounted and on a rear surface of which a land conductor is provided, and an insulating resin covering the front surface of the mounting substrate.

2. Description of the Related Art

Recently, various techniques have been proposed to form a single packaged module by using a plurality of electronic components to achieve a predetermined function.

For example, Japanese Unexamined Patent Application Publication No. 2003-124701 describes a high-frequency module in which an electronic component is mounted on a front surface of a substrate. In the high-frequency module described in Japanese Unexamined Patent Application Publication No. 2003-124701, a plurality of land conductors are provided on a rear surface of the substrate. In addition, in the high-frequency module disclosed in Japanese Unexamined Patent Application Publication No. 2003-124701, the front surface of the substrate is covered with a sealing resin.

However, in a case in which the substrate is covered with the sealing resin, the substrate may be warped due to a thermal history of the high-frequency module affected by a difference between a coefficient of linear expansion of the substrate and a coefficient of linear expansion of the sealing resin.

In this case, since the rear surface of the substrate is warped, it becomes difficult to mount the high-frequency module on a circuit substrate.

SUMMARY OF THE INVENTION

Preferred embodiments of the present invention provide high-frequency modules that are able to be mounted on a circuit substrate by reducing or preventing an influence on mounting due to warpage, even when a configuration in which a front surface of a substrate is covered with a sealing resin is used.

A high-frequency module according to a preferred embodiment of the present invention includes a mounting substrate, an electronic component, a sealing resin, and a plurality of land conductors. The mounting substrate includes a first main surface and a second main surface opposite to each other. The electronic component is mounted on the first main surface of the mounting substrate. The sealing resin covers the first main surface of the mounting substrate and at least a portion of the plurality of electronic components. The plurality of land conductors are provided on the second main surface of the mounting substrate. The plurality of land conductors include a first land conductor and a second land conductor disposed closer to a center than the first land conductor. The first land conductor includes a first main surface on a mounting substrate side and a second main surface opposite to the first main surface, and the second land conductor includes a first main surface on the mounting substrate side and a second main surface opposite to the first main surface. A distance between the second main surface of the first land conductor and the second main surface of the mounting substrate is larger than a distance between the second main surface of the second land conductor and the second main surface of the mounting substrate.

In this configuration, even when the substrate is warped due to the thermal history such that a first end surface is closer to the front surface side of the substrate relative to the center, a position difference in a height direction between the second main surface (first mounting surface) of the first land conductor and the second main surface (second mounting surface) of the second land conductor is small.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the accompanying drawings.

Figure 1:
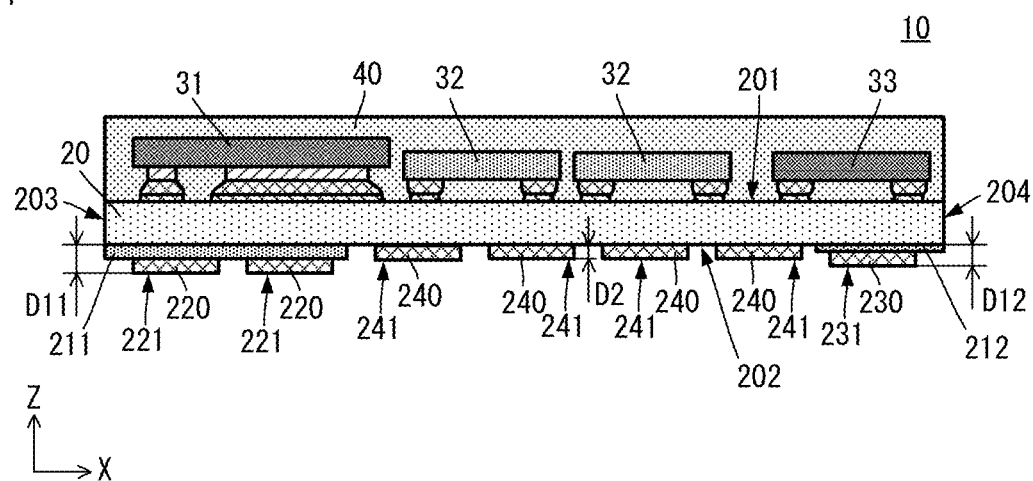
FIG. 1 is a first side sectional view illustrating a configuration of a high-frequency module according to a first preferred embodiment of the present invention.
Figure 2:
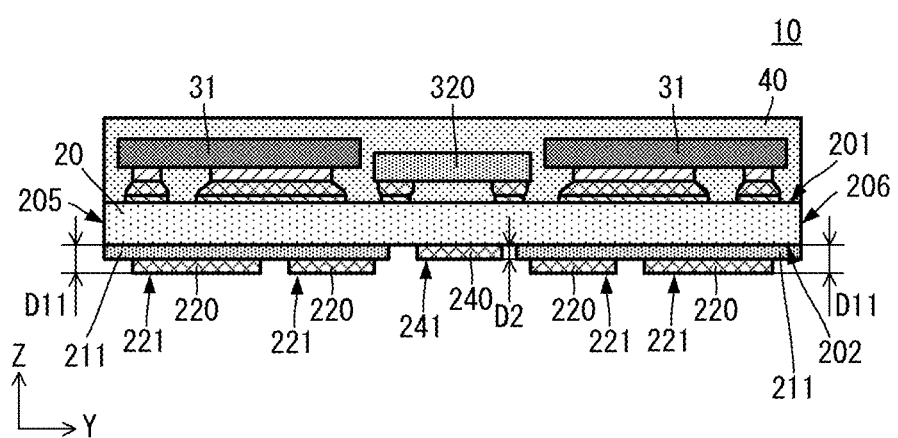
FIG. 2 is a second side sectional view illustrating the configuration of the high-frequency module according to the first preferred embodiment of the present invention.
Figure 3:
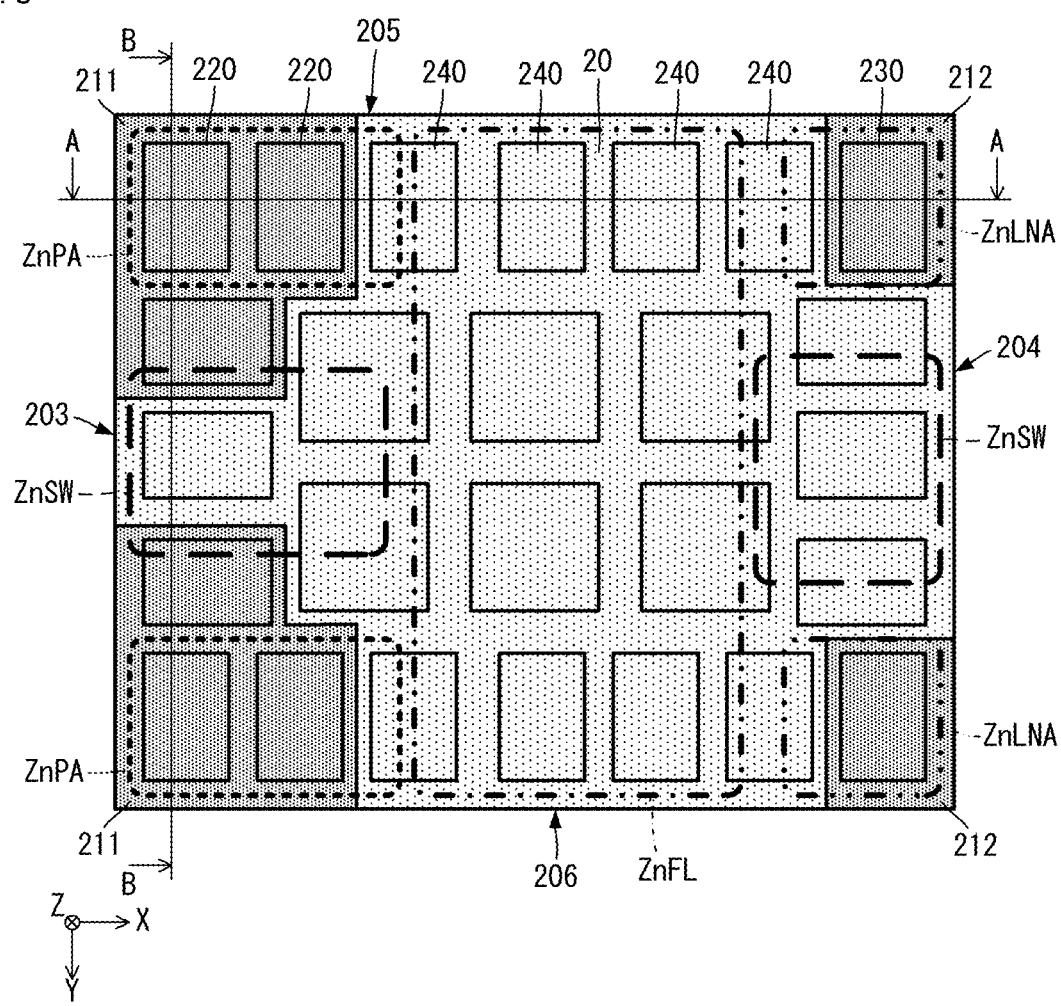
FIG. 3 is a plan view illustrating the configuration of the high-frequency module according to the first preferred embodiment of the present invention.

A high-frequency module according to a first preferred embodiment of the present invention will be described with reference to the accompanying drawings. FIG. 1 is a first side sectional view illustrating a configuration of the high-frequency module according to the first preferred embodiment of the present invention. FIG. 1 illustrates a cross section taken along a line A-A illustrated in FIG. 3. FIG. 2 is a second side sectional view illustrating the configuration of the high-frequency module according to the first preferred embodiment of the present invention. FIG. 2 illustrates a cross section taken along a line B-B illustrated in FIG. 3. FIG. 3 is a plan view illustrating the configuration of the high-frequency module according to the first preferred embodiment of the present invention. Note that FIG. 3 is a view of the mounting substrate as viewed from the rear surface side, and ZnPA, ZnLNA, ZnSW, and ZnFL indicate regions on the front surface side of the mounting substrate.

As illustrated in FIG. 1, FIG. 2, and FIG. 3, a high-frequency module 10 includes a mounting substrate 20, an electronic component 31, an electronic component 32, an electronic component 33, and a sealing resin 40.

The mounting substrate 20 is preferably, for example, a flat or substantially flat plate having a rectangular or substantially rectangular parallelepiped shape. The mounting substrate 20 includes a front surface 201, a rear surface 202, a side surface 203, a side surface 204, a side surface 205, and a side surface 206. The side surface 203 and the side surface 204 are opposite to each other, and the side surface 205 and the side surface 206 are opposite to each other. The front surface 201 corresponds to "a first main surface of the mounting substrate", and the rear surface 202 corresponds to "a second main surface of the mounting substrate".

Here, a direction from the side surface 203 toward the side surface 204 is defined as an X direction, a direction from the side surface 205 toward the side surface 206 is defined as a Y direction, and a direction from the rear surface 202 toward the front surface 201 is defined as a Z direction.

The mounting substrate 20 mainly includes an insulating material, such as ceramic or glass epoxy resin, for example, and a conductor pattern defining the high-frequency module 10. The mounting substrate 20 may be a single substrate, or may be a multilayer body including a plurality of insulating layers that are laminated. The plurality of conductor patterns for mounting components are provided on the front surface 201 of the mounting substrate 20.

On the front surface 201 of the mounting substrate 20, the electronic component 31, the electronic component 32, and the electronic component 33 are mounted on the plurality of conductor patterns for mounting components. The electronic component 31 is mounted at a position close to the side surface 203, and the electronic component 33 is mounted at a position close to the side surface 204. The electronic component 32 is mounted in a region between the electronic component 31 and the electronic component 33.

The sealing resin 40 is provided on the front surface 201 of the mounting substrate 20 so as to cover the electronic component 31, the electronic component 32, and the electronic component 33. The sealing resin 40 is preferably made of, for example, epoxy resin or other suitable material. The sealing resin 40 has a coefficient of linear expansion different from that of the mounting substrate 20.

On the rear surface 202 of the mounting substrate 20, a land conductor 220, a land conductor 230, and a land conductor 240 are provided. A predetermined number of land conductors 220, land conductors 230, and land conductors 240 are provided in accordance with the specifications of the high-frequency module 10. The shape of the land conductor 220, the land conductor 230, or the land conductor 240 in the plan view is preferably, for example, rectangular or substantially rectangular. The land conductor 220, the land conductor 230, and the land conductor 240 preferably have the same or substantially the same thickness.

As illustrated in FIG. 1, FIG. 2, and FIG. 3, the land conductor 220, the land conductor 230, and the land conductor 240 are disposed in a predetermined arrangement pattern in accordance with the specifications of the high-frequency module 10.

For example, as illustrated in FIG. 1, the land conductor 220, the land conductor 240, and the land conductor 230 are disposed in this order from the side surface 203 of the mounting substrate 20 toward the side surface 204 (along a first direction (X direction)). In other words, when the side surface 203 is set as a reference, the land conductor 220 is disposed in a region close to the side surface 203, and the land conductor 240 is disposed in a region farther away from the side surface 203 than the land conductor 220 (closer to the center than the land conductor 220 in the first direction). That is, when the side surface 203 is defined as a "first side surface", the land conductor 220 corresponds to a "first land conductor", and the land conductor 240 corresponds to a "second land conductor". The land conductor 220 includes a main surface on the mounting substrate 20 side (corresponding to "a first main surface of the first land conductor") and a mounting surface 221 opposite to the main surface. The mounting surface 221 corresponds to "a second main surface of the first land conductor". The land conductor 240 includes a main surface on the mounting substrate 20 side (corresponding to "a first main surface of the second land conductor") and a mounting surface 241 opposite to the main surface. The mounting surface 241 corresponds to "a second main surface of the second land conductor".

When the side surface 204 is set as a reference, the land conductor 230 is disposed in a region close to the side surface 204, and the land conductor 240 is disposed in a region farther away from the side surface 204 than the land conductor 230 (closer to the center than the land conductor 230 in the first direction). That is, when the side surface 204 is defined as the "first side surface", the land conductor 230 corresponds to the "first land conductor", and the land conductor 240 corresponds to the "second land conductor". The land conductor 230 includes a main surface on the mounting substrate 20 side (corresponding to the "a first main surface of the first land conductor") and a mounting surface 231 opposite to the main surface. The mounting surface 231 corresponds to the "a second main surface of the first land conductor".

An insulating auxiliary layer 211 is disposed between the land conductor 220 and the rear surface 202 of the mounting substrate 20. The insulating auxiliary layer 211 is preferably made of, for example, a material the same as or similar to that of the mounting substrate 20. On the other hand, the land conductor 240 is in contact with the rear surface 202 of the mounting substrate 20. In other words, no other member is interposed between the land conductor 240 and the rear surface 202 of the mounting substrate 20.

With such a configuration, a distance D11 between the mounting surface 221 of the land conductor 220 and the rear surface 202 of the mounting substrate 20 is larger than a distance D2 between the mounting surface 241 of the land conductor 240 and the rear surface 202 of the mounting substrate 20 (D11>D2). This difference in distance is determined by the difference between the coefficient of linear expansion of the mounting substrate 20 and the coefficient of linear expansion of the sealing resin 40, and the area of the mounting substrate 20.

Here, when the high-frequency module 10 is formed, for example, when the sealing resin 40 is applied and solidification is performed, upon being heated, the mounting substrate 20 is warped toward the front surface 201 side of the mounting substrate from the center toward the side surface 203 due to the difference in the coefficient of linear expansion between the mounting substrate 20 and the sealing resin 40.

However, with the above-described configuration, a difference in position in a height direction (Z direction) between the mounting surface 221 of the land conductor 220 and the mounting surface 241 of the land conductor 240 is reduced due to the difference between the distance D11 and the distance D2.

Figure 4A:
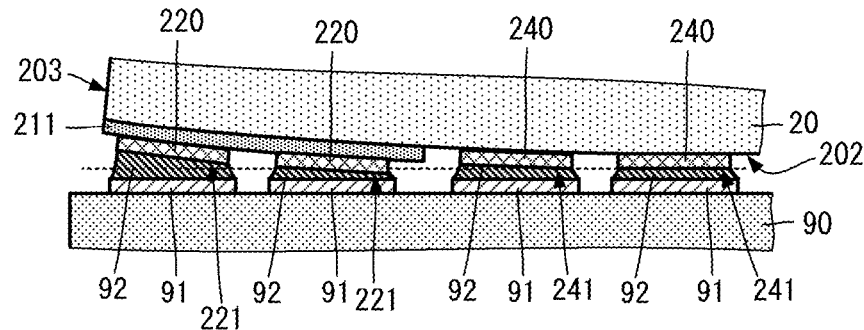
FIG. 4A is a schematic diagram illustrating a state of mounting on another circuit substrate in a case in which the configuration according to the first preferred embodiment of the present invention is used.
Figure 4B:
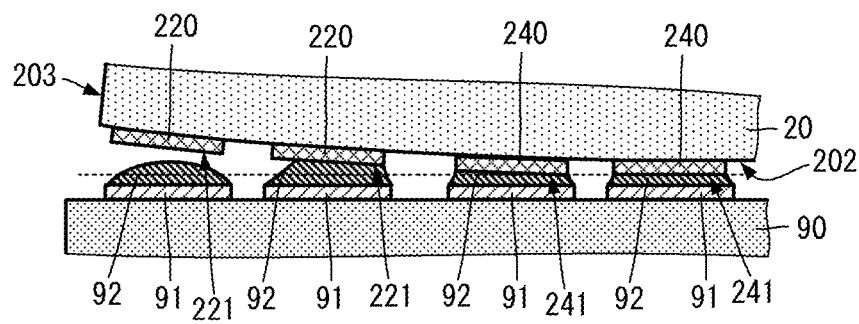
FIG. 4B is a schematic diagram illustrating a state of mounting on another circuit substrate in a case in which a configuration of the related art (comparative configuration) is used.

FIG. 4A is a schematic diagram illustrating a state of mounting on another circuit substrate in a case in which the configuration according to the first preferred embodiment of the present invention is used, and FIG. 4B is a schematic diagram illustrating a state of mounting on another circuit substrate in a case in which a configuration of the related art (comparative configuration) is used.

As illustrated in FIG. 4A, when the configuration of the present preferred embodiment is used, it is possible to reduce or prevent separation of the land conductor 220 in the vicinity of the side surface 203 from a conductor pattern 91 for mounting on a circuit substrate 90 even when the mounting substrate 20 is warped. Then, the land conductor 220 is able to be bonded to the conductor pattern 91 by a solder 92.

On the other hand, as illustrated in FIG. 4B, without using the configuration of the present preferred embodiment, the land conductor 220 in the vicinity of the side surface 203 is separated from the conductor pattern 91 for mounting on the circuit substrate 90 due to the warpage of the mounting substrate 20. Therefore, as illustrated in FIG. 4B, a bonding area of the land conductor 220 and the conductor pattern 91 is small, and in the worst case, the land conductor 220 and the conductor pattern 91 are not able to be bonded.

Thus, by using the configuration of the present preferred embodiment, it is possible to easily mount the land conductor 220 of the high-frequency module 10 on the circuit substrate 90. Note that as illustrated in FIG. 4A, the land conductor 240 that is not affected by the warpage is able to be naturally mounted on the circuit substrate 90.

In the above description, the case of the X direction and the case of the vicinity of the side surface 203 are illustrated as an example, but the same is also applied to the vicinity of the side surface 204 in the X direction as illustrated in FIG. 1.

An insulating auxiliary layer 212 is disposed between the land conductor 230 and the rear surface 202 of the mounting substrate 20. The insulating auxiliary layer 212 is preferably made of, for example, a material the same as or similar to that of the mounting substrate 20. On the other hand, the land conductor 240 is in contact with the rear surface 202 of the mounting substrate 20.

With such a configuration, a distance D12 between the mounting surface 231 of the land conductor 230 and the rear surface 202 of the mounting substrate 20 is larger than the distance D2 between the mounting surface 241 of the land conductor 240 and the rear surface 202 of the mounting substrate 20 (D12>D2: see FIG. 1).

Accordingly, even when the mounting substrate 20 is warped, the land conductor 230 in the vicinity of the side surface 204 is able to be mounted on another circuit substrate.

Further, while the above description has been provided with respect to the X direction, the same applies to the Y direction. As illustrated in FIG. 2, in the Y direction, the land conductor 220, the land conductor 240, and the land conductor 220 are disposed in this order from the side surface 205 toward the side surface 206. The auxiliary layer 211 is disposed between the land conductor 220 and the rear surface 202 of the mounting substrate 20.

With such a configuration, the distance D11 between the mounting surface 221 of the land conductor 220 in the vicinity of the side surface 205 and in the vicinity of the side surface 206 and the rear surface 202 of the mounting substrate 20 is larger than the distance D2 between the mounting surface 241 of the land conductor 240 and the rear surface 202 of the mounting substrate (D11>D2).

Accordingly, even when the mounting substrate 20 is warped, the land conductor 220 in the vicinity of the side surface 205 and the land conductor 220 in the vicinity of the side surface 206 are able to be reliably mounted on another circuit substrate.

As described above, by using the configuration of the present preferred embodiment, even when the mounting substrate 20 is warped, all of the land conductor 220, the land conductor 230, and the land conductor 240 are able to be mounted on another circuit substrate.

In addition, in this configuration, the auxiliary layer 211 and the auxiliary layer 212 are made of a material the same as or similar to that of the mounting substrate 20. Thus, the auxiliary layer 211 and the auxiliary layer 212, and the mounting substrate 20 are able to be laminated to easily obtain the configuration. In other words, it is possible to easily provide a structure that reduces or prevents an adverse effect of warpage of the mounting substrate 20. Further, by including the auxiliary layer 211 and the auxiliary layer 212, it is also possible to relax the warpage itself in the vicinity of each side surface.

Further, in this configuration, since the land conductor 220, the land conductor 230, and the land conductor 240 have the same or substantially the same thickness, the land conductor 220, the land conductor 230, and the land conductor 240 are able to be formed at the same time under one type of condition in one process. Accordingly, it is possible to easily obtain the high-frequency module 10.

Furthermore, in the configuration of the present preferred embodiment, the following advantageous functions and effects are able to be obtained. The high-frequency module 10 achieves, for example, a high-frequency front end circuit for radio communication. In this case, an electronic component defining a power amplifier PA is used as the electronic component 31. In other words, the electronic component 31 is a high heat-generating electronic component. An electronic component defining a low noise amplifier LNA is used as the electronic component 33. In other words, the electronic component 33 is a low heat-generating electronic component. An electronic component defining a switch, a filter, and a duplexer is used as an electronic component 32. In other words, the electronic component 32 is an electronic component that generates almost no heat.

The electronic component 31 is mounted on the mounting substrate 20 so as to overlap with a region ZnPA illustrated in FIG. 3. The electronic component 33 is mounted on the mounting substrate 20 so as to overlap with a region ZnLNA illustrated in FIG. 3. The electronic component 32 defining a filter and a duplexer is mounted on the mounting substrate 20 so as to overlap with a region ZnFL illustrated in FIG. 3. The electronic component 32 defining the switch is mounted on the mounting substrate 20 so as to overlap with a region ZnSW illustrated in FIG. 3.

In view of heat radiation performance, it is preferable that the high heat-generating electronic component 31 is disposed in the vicinity of the side surface of the mounting substrate 20. In other words, by disposing the high heat-generating electronic component 31 in the vicinity of the side surface of the mounting substrate 20, heat from the electronic component 31 is able to be easily radiated to the outside of the high-frequency module 10. Thus, as illustrated in FIG. 3, the region ZnPA is located at a position close to the side surface 203. Thus, heat radiation efficiency of the electronic component 31 is able to be improved.

Furthermore, in this configuration, the region ZnPA overlaps with the region in which the auxiliary layer 211 is disposed. Therefore, for example, even when the mounting substrate 20 is warped due to the heat of the electronic component 31, the distance between the circuit substrate and the mounting surface 221 of the land conductor 220 is able to be reduced by providing the auxiliary layer 211. Thus, it is possible to maintain the mounting state of the land conductor 220.

In addition, in this configuration, the region ZnLNA is located at a position close to the side surface 204. Accordingly, even when the electronic component 33 generates heat and the mounting substrate 20 is warped, the distance between the circuit substrate and the land conductor 230 is able to be reduced by providing the auxiliary layer 212. Thus, it is possible to maintain the mounting state of the land conductor 230.

As described above, the high-frequency module 10 is able to reduce or prevent the mounting failure on the circuit substrate due to the warpage of the mounting substrate 20 caused by the thermal history during the operation of the high-frequency module at the time of forming the high-frequency module 10 while securing the heat radiation performance of the electronic component to be mounted.

Figure 5:
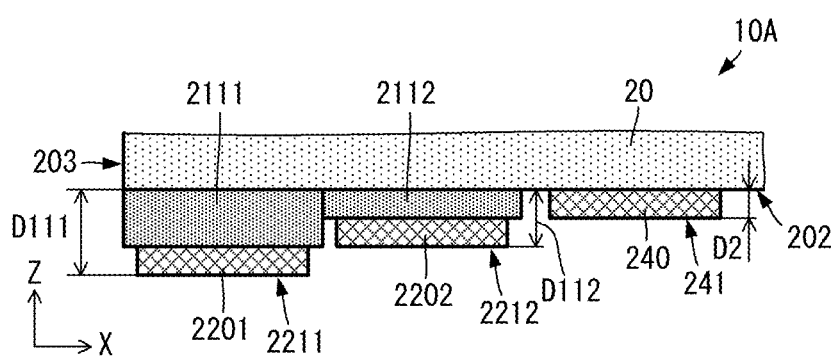
FIG. 5 is a side sectional view illustrating a portion of a configuration of a high-frequency module according to a second preferred embodiment of the present invention.

Next, a high-frequency module according to a second preferred embodiment of the present invention will be described with reference to the accompanying drawings. FIG. 5 is a side sectional view illustrating a portion of a configuration of the high-frequency module according to the second preferred embodiment of the present invention.

As illustrated in FIG. 5, a high-frequency module 10A according to the second preferred embodiment differs from the high-frequency module 10 according to the first preferred embodiment in a configuration in the vicinity of the side surface of the mounting substrate 20. Other configurations of the high-frequency module 10A are the same or substantially the same as those of the high-frequency module 10, and descriptions of the same or similar portions will be omitted.

As illustrated in FIG. 5, the high-frequency module 10A includes a land conductor 2201, a land conductor 2202, and a land conductor 240. The land conductor 2201, the land conductor 2202, and the land conductor 240 are provided on the rear surface 202 side of the mounting substrate 20. A thickness of the land conductor 2201, a thickness of the land conductor 2202, and a thickness of the land conductor 240 are preferably the same or substantially the same.

The land conductor 2201, the land conductor 2202, and the land conductor 240 are disposed in this order from the side surface 203 side along the X direction of the mounting substrate 20. In this case, when the side surface 203 is defined as the "first side surface", the land conductor 2201 corresponds to the "first land conductor", the land conductor 240 corresponds to the "second land conductor", and the land conductor 2202 corresponds to a "third land conductor".

The land conductor 2201 includes a main surface on the mounting substrate 20 side (corresponding to "a first main surface of the first land conductor") and a mounting surface 2211 opposite to the main surface. The mounting surface 2211 corresponds to "a second main surface of the first land conductor". The land conductor 240 includes a main surface on the mounting substrate 20 side (corresponding to "a first main surface of the second land conductor") and a mounting surface 241 opposite to the main surface. The mounting surface 241 corresponds to "a second main surface of the second land conductor". The land conductor 2202 includes a main surface of the mounting substrate 20 side (corresponding to "a first main surface of the third land conductor") and a mounting surface 2212 opposite to the main surface. The mounting surface 2212 corresponds to "a second main surface of the third land conductor".

An insulating auxiliary layer 2111 is disposed between the land conductor 2201 and the rear surface 202 of the mounting substrate 20. An insulating auxiliary layer 2112 is disposed between the land conductor 2202 and the rear surface 202 of the mounting substrate 20. The auxiliary layer 2111 and the auxiliary layer 2112 are preferably made of a material the same as or similar to that of the mounting substrate 20.

A thickness of the auxiliary layer 2111 is larger than a thickness of the auxiliary layer 2112.

Accordingly, a distance D111 between the mounting surface 2211 of the land conductor 2201 and the rear surface 202 of the mounting substrate 20 is larger than a distance D112 between the mounting surface 2212 of the land conductor 2202 and the rear surface 202 of the mounting substrate 20. Further, the distance D112 between the mounting surface 2212 of the land conductor 2202 and the rear surface 202 of the mounting substrate 20 is larger than the distance D2 between the mounting surface 241 of the land conductor 240 and the rear surface 202 of the mounting substrate 20. Namely, D111>D112>D2 is satisfied.

Thus, differences among a position of the mounting surface 241 of the land conductor 240, a position of the mounting surface 2212 of the land conductor 2202, and a position of the mounting surface 2211 of the land conductor 2201 are reduced in a thickness direction (Z direction).

Figure 6:
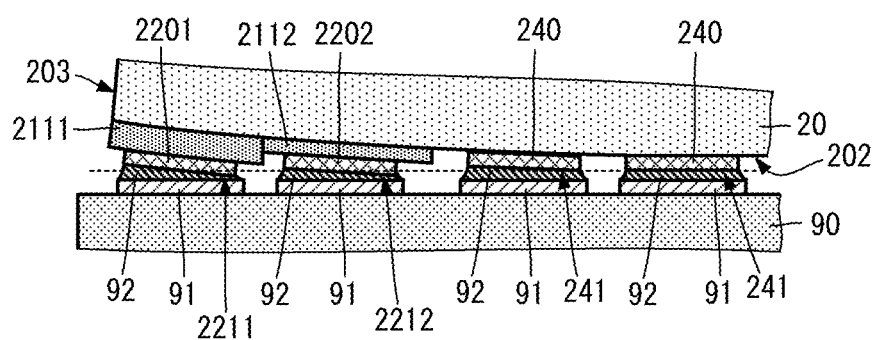
FIG. 6 is a schematic diagram illustrating a state of mounting on another circuit substrate in a case in which the configuration according to the second preferred embodiment of the present invention is used.

FIG. 6 is a schematic diagram illustrating a state of mounting on another circuit substrate in a case in which a configuration according to the second preferred embodiment of the present invention is used. As illustrated in FIG. 6, by using the configuration of the present preferred embodiment, it is possible to reduce or prevent separation of the land conductor 2201 and the land conductor 2202 in the vicinity of the side surface 203 from the conductor pattern 91 for mounting on the circuit substrate 90 even when the mounting substrate 20 is warped. Then, the land conductor 2201 and the land conductor 2202 are able to be more reliably bonded to the respective conductor patterns 91 by the solder 92.

As described above, the high-frequency module 10A is able to further reliably reduce or prevent the mounting failure on the circuit substrate due to the warpage of the mounting substrate 20 caused by the thermal history.

Figure 7:
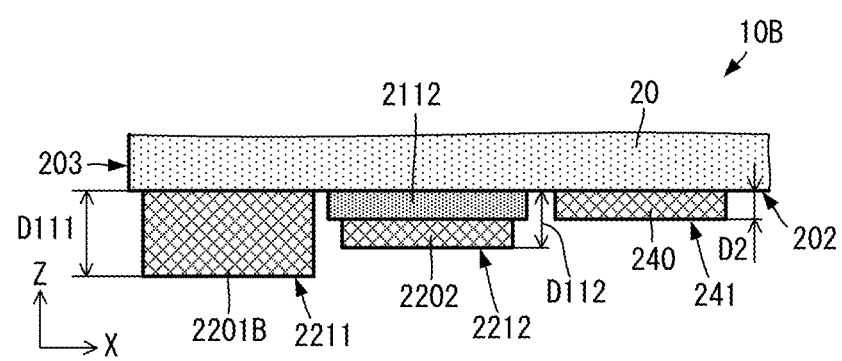
FIG. 7 is a side sectional view illustrating a portion of a configuration of a high-frequency module according to a third preferred embodiment of the present invention.

Next, a high-frequency module according to a third preferred embodiment of the present invention will be described with reference to the accompanying drawings. FIG. 7 is a side sectional view illustrating a portion of the configuration of the high-frequency module according to the third preferred embodiment of the present invention.

As illustrated in FIG. 7, a high-frequency module 10B according to the third preferred embodiment is different from the high-frequency module 10A according to the second preferred embodiment in the configuration in the vicinity of the side surface of the mounting substrate 20. Other configurations of the high-frequency module 10B are the same or substantially the same as those of the high-frequency module 10A, and descriptions of the same or similar portions will be omitted.

As illustrated in FIG. 7, the high-frequency module 10B includes a land conductor 2201B. However, in the high-frequency module 10B, the auxiliary layer 2111 is omitted from the high-frequency module 10A.

A thickness of the land conductor 2201B is larger than the thickness of the land conductor 240 and the land conductor 2202. The thickness of the land conductor 2201B is preferably equal or substantially equal to a combined thickness of the land conductor 2201 and the auxiliary layer 2111 in the high-frequency module 10A. Therefore, the distance D111 between the mounting surface 2211 of the land conductor 2201B and the rear surface 202 of the mounting substrate 20 is larger than the distance D112 between the mounting surface 2212 of the land conductor 2202 and the rear surface 202 of the mounting substrate 20. Namely, D111>D112 (>D2) is satisfied.

Therefore, the differences among the position of the mounting surface 241 of the land conductor 240, the position of the mounting surface 2212 of the land conductor 2202, and the position of the mounting surface 2211 of the land conductor 2201B are reduced in the thickness direction (Z direction). As a result, in the high-frequency module 10B, as in the case of the high-frequency module 10A, it is possible to further reduce or prevent the mounting failure on the circuit substrate due to the warpage of the mounting substrate 20 caused by the thermal history.

In addition, since a difference in height is achieved only by the thickness of the land conductor, it is not necessary to provide an auxiliary layer. Accordingly, it is possible to manufacture the high-frequency module 10B in a simpler process.

Figure 8:
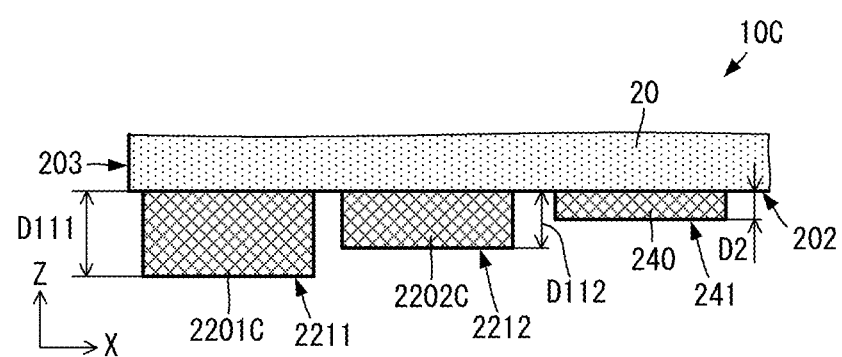
FIG. 8 is a side sectional view illustrating a portion of a configuration of a high-frequency module according to a fourth preferred embodiment of the present invention.

Next, a high-frequency module according to a fourth preferred embodiment of the present invention will be described with reference to the accompanying drawings. FIG. 8 is a side sectional view illustrating a portion of a configuration of the high-frequency module according to the fourth preferred embodiment of the present invention.

As illustrated in FIG. 8, a high-frequency module 10C according to the fourth preferred embodiment is different from the high-frequency module 10B according to the third preferred embodiment in the configuration in the vicinity of the side surface of the mounting substrate 20. Other configurations of the high-frequency module 10C are the same or similar to those of the high-frequency module 10B, and descriptions of the same or similar portions will be omitted.

As illustrated in FIG. 8, the high-frequency module 10C includes a land conductor 2201C and a land conductor 2202C. The land conductor 2201C is the same or substantially the same as the land conductor 2201B of the high-frequency module 10B. However, in the high-frequency module 10C, the configuration is such that the auxiliary layer 2112 is omitted from the high-frequency module 10B.

A thickness of the land conductor 2202C is larger than the thickness of the land conductor 240, and is smaller than a thickness of the land conductor 2201C. The thickness of the land conductor 2202C is the same or substantially the same as a combined thickness of the land conductor 2202 and the auxiliary layer 2112 in each of the high-frequency modules 10A and 10B. Therefore, the distance D112 between the mounting surface 2212 of the land conductor 2202C and the rear surface 202 of the mounting substrate 20 is smaller than the distance D111 between the mounting surface 2211 of the land conductor 2201C and the rear surface 202 of the mounting substrate 20. Further, the distance D112 between the mounting surface 2212 of the land conductor 2202C and the rear surface 202 of the mounting substrate 20 is larger than the distance D2 between the mounting surface 241 of the land conductor 240 and the rear surface 202 of the mounting substrate 20. Namely, D111>D112>D2 is satisfied.

Accordingly, in the thickness direction (Z direction), the differences among the position of the mounting surface 241 of the land conductor 240, the position of the mounting surface 2212 of the land conductor 2202C, and the position of the mounting surface 2211 of the land conductor 2201C are reduced respectively. As a result, in the high-frequency module 10C, as in the case of the high-frequency modules 10A and 10B, it is possible to further reduce or prevent the mounting failure on the circuit substrate due to the warpage of the mounting substrate 20 caused by the thermal history.

In addition, in the above description, the preferred embodiments have been illustrated in which an electronic component is mounted on the front surface 201 of the mounting substrate 20 and covered with the sealing resin 40. However, an electronic component may be mounted on the rear surface 202 of the mounting substrate 20 and covered with a sealing resin. Even in this case, a difference in the coefficient of linear expansion between the front surface 201 side of the mounting substrate 20 and the rear surface 202 side of the mounting substrate 20 may occur due to a difference between the configuration on the front surface 201 side and the configuration on the rear surface 202 side. In this case, by applying the above-described configuration, it is possible to obtain the same or substantially the same advantageous operations and effects as in the case described above.

In addition, in the above description, the preferred embodiments have been illustrated in which the distance between the mounting surface of the land conductor and the rear surface of the mounting substrate is changed according to the position of the land conductor by the thickness of the land conductor or by disposing the auxiliary layer between the land conductor and the mounting substrate.

However, by providing an additional layer of a conductive member, such as solder, for example, on the front surface of the land conductor, a distance between the mounting surface and the rear surface of the mounting substrate may be adjusted. For example, according to the configuration of FIG. 1 described above, a height of a conductive member provided on the mounting surface 221 of the land conductor 220 may be higher than that of a conductive member provided on the mounting surface 241 of the land conductor 240. In other words, a distance between an end of the solder provided on the land conductor 220 and the rear surface 202 of the mounting substrate 20 may be larger than a distance between an end of the solder provided on the land conductor 240 and the rear surface 202 of the mounting substrate 20. In this case, the auxiliary layer 211 may not be used, or may be used.

Note that, in the above described configuration, rather than adjusting the height using solder, it is preferable to adjust the height by providing the auxiliary layer, or to adjust the height of the land conductor. This is because it is not necessary to provide a process of soldering in a manufacturing process of the high-frequency module, and it is not necessary to adjust the height of the solder. Therefore, it is possible to simplify the process of manufacturing the high-frequency module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
a mounting substrate including a first main surface and a second main surface opposite to each other;
a plurality of electronic components mounted on the first main surface of the mounting substrate;
a sealing resin covering the first main surface of the mounting substrate and at least a portion of the plurality of electronic components; and
a plurality of land conductors provided on the second main surface of the mounting substrate; wherein
the plurality of land conductors includes:
a first land conductor; and
a second land conductor disposed closer to a center than the first land conductor;
the first land conductor includes a first main surface on a mounting substrate side and a second main surface opposite to the first main surface;
the second land conductor includes a first main surface on the mounting substrate side and a second main surface opposite to the first main surface;
a distance between the second main surface of the first land conductor and the second main surface of the mounting substrate is larger than a distance between the second main surface of the second land conductor and the second main surface of the mounting substrate;
the plurality of electronic components includes a first electronic component and a second electronic component;
the second electronic component generates more heat than the first electronic component;
the second electronic component overlaps with the first land conductor when viewing the mounting substrate in a plan view; and
the first and second electronic components are spaced-apart from one another in a direction that is perpendicular or substantially perpendicular to the first main surface of the mounting substrate when viewing the mounting substrate in the plan view.

2. The high-frequency module according to claim 1, wherein a thickness of the first land conductor is larger than a thickness of the second land conductor.

3. The high-frequency module according to claim 1, further comprising an insulating auxiliary layer between the first land conductor and the mounting substrate.

4. The high-frequency module according to claim 1, wherein
the plurality of land conductors further include a third land conductor between the first land conductor and the second land conductor;
the third land conductor includes a first main surface on the mounting substrate side and a second main surface opposite to the first main surface; and
a distance between the second main surface of the third land conductor and the second main surface of the mounting substrate is larger than a distance between the second main surface of the second land conductor and the second main surface of the mounting substrate.

5. The high-frequency module according to claim 4, further comprising an insulating auxiliary layer between the third land conductor and the mounting substrate.

6. The high-frequency module according to claim 4, further comprising an insulating auxiliary layer between the first land conductor and the mounting substrate, and another auxiliary layer between the third land conductor and the mounting substrate.

7. The high-frequency module according to claim 6, wherein a thickness of the insulating layer is larger than a thickness of the another auxiliary layer.

8. The high-frequency module according to claim 4, wherein the first, second, and third land conductors have equal or substantially equal thicknesses.

9. The high-frequency module according to claim 4, wherein
the second and third land conductors have equal or substantially equal thicknesses; and
the first land conductor has a thickness greater than the thicknesses of the second and third land conductors.

10. The high-frequency module according to claim 4, wherein the first, second, and third land conductors have different thickness from each other.

11. The high-frequency module according to claim 1, wherein the mounting substrate is a flat or substantially flat plate having a rectangular or substantially rectangular parallelepiped shape.

12. The high-frequency module according to claim 1, wherein the mounting substrate includes an insulating material and a conductor pattern.

13. The high-frequency module according to claim 1, wherein the insulating material is at least one of ceramic and glass epoxy resin.

14. The high-frequency module according to claim 1, wherein the sealing resin is made of epoxy resin.

15. The high-frequency module according to claim 1, wherein the first and second land conductors have equal or substantially equal thicknesses.

16. The high-frequency module according to claim 1, wherein the second electronic component includes a power amplifier.

17. The high-frequency module according to claim 1, wherein
an insulating auxiliary layer is provided between the first land conductor and the mounting substrate; and
no insulating auxiliary layer is provided between the second land conductor and the mounting substrate.

* * * * *